(12) United States Patent
Lee et al.

(10) Patent No.: US 11,476,297 B2
(45) Date of Patent: Oct. 18, 2022

(54) DISPLAY APPARATUS

(71) Applicant: Samsung Display Co., Ltd., Yongin-si (KR)

(72) Inventors: Haeyeon Lee, Yongin-si (KR); Dongsoo Kim, Yongin-si (KR); Donghoon Lee, Yongin-si (KR); Jieun Lee, Yongin-si (KR); Changkyu Jin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 164 days.

(21) Appl. No.: 15/720,524

(22) Filed: Sep. 29, 2017

(65) Prior Publication Data

US 2018/0097034 A1 Apr. 5, 2018

(30) Foreign Application Priority Data

Sep. 30, 2016 (KR) .................. 10-2016-0127155

(51) Int. Cl.
*H01L 27/15* (2006.01)
*H01L 23/08* (2006.01)
*H01L 23/532* (2006.01)
*H01L 23/31* (2006.01)
(Continued)

(52) U.S. Cl.
CPC ............ *H01L 27/156* (2013.01); *H01L 23/08* (2013.01); *H01L 23/3142* (2013.01); *H01L 23/5329* (2013.01); *H01L 27/3258* (2013.01); *H01L 27/3276* (2013.01); *H01L 51/5253* (2013.01); *H01L 2924/183* (2013.01)

(58) Field of Classification Search
CPC combination set(s) only.
See application file for complete search history.

(56) References Cited

U.S. PATENT DOCUMENTS 9,000,428 B2 4/2015 Lee et al.
9,163,163 B2 10/2015 Bulliard et al.
9,478,770 B2 * 10/2016 Kim .................. H01L 51/5203
(Continued)

FOREIGN PATENT DOCUMENTS

KR 10-2010-0048035 A 5/2010
KR 10-2014-0133053 A 11/2014
(Continued)

*Primary Examiner* — Abul Kalam
(74) *Attorney, Agent, or Firm* — Lewis Roca Rothgerber Christie LLP

(57) ABSTRACT

A display apparatus includes: a substrate having a display area and a peripheral area outside the display area; a first insulating layer over both the display area and the peripheral area; a first dam over the peripheral area and spaced apart from the first insulating layer; an electrode power supply line, at least a part of the electrode power supply line being located between the first insulating layer and the first dam; a protection conductive layer over the first insulating layer, the protection conductive layer extending over the electrode power supply line and electrically connected to the electrode power supply line; a pixel electrode over the first insulating layer in the display area; an opposite electrode over the pixel electrode; and a capping layer covering the opposite electrode and extending outside the opposite electrode such that an end of the capping layer is on the first insulating layer.

15 Claims, 5 Drawing Sheets

(51) Int. Cl.
   *H01L 51/52*     (2006.01)
   *H01L 27/32*     (2006.01)

(56) References Cited

U.S. PATENT DOCUMENTS

| | | | |
|---|---|---|---|
| 9,614,180 B2* | 4/2017 | Kang | H01L 51/5253 |
| 9,627,647 B2* | 4/2017 | Kim | H01L 51/5253 |
| 9,923,167 B2* | 3/2018 | Choi | H01L 51/5253 |
| 9,941,484 B2* | 4/2018 | Kim | H01L 51/5203 |
| 2013/0230664 A1* | 9/2013 | Park | H01L 51/5253 |
| | | | 427/523 |
| 2015/0021565 A1 | 1/2015 | Min et al. | |
| 2015/0228927 A1 | 8/2015 | Kim | |
| 2016/0093828 A1* | 3/2016 | Kim | H01L 51/5253 |
| | | | 257/40 |
| 2016/0260928 A1 | 9/2016 | Choi et al. | |
| 2016/0285038 A1* | 9/2016 | Kim | H01L 51/5237 |
| 2017/0047544 A1* | 2/2017 | Kang | G04B 19/04 |
| 2018/0212188 A1* | 7/2018 | Kwon | H01L 51/5253 |

FOREIGN PATENT DOCUMENTS

| | | |
|---|---|---|
| KR | 10-2015-0011231 A | 1/2015 |
| KR | 10-2015-0094950 A | 8/2015 |
| KR | 10-2016-0066316 A | 6/2016 |
| KR | 10-2016-0108800 A | 9/2016 |

\* cited by examiner

DISPLAY APPARATUS

CROSS-REFERENCE TO RELATED APPLICATION

This application claims priority to and the benefit of Korean Patent Application No. 10-2016-0127155, filed on Sep. 30, 2016 in the Korean Intellectual Property Office, the entire disclosure of which is incorporated herein by reference.

BACKGROUND

1. Field

One or more embodiments relate to a display apparatus.

2. Description of the Related Art

General display apparatuses include a stack of various layers. For example, in organic light-emitting display apparatuses, each sub-pixel includes an organic light-emitting diode (OLED) that includes a pixel electrode, an intermediate layer including an emission layer, and an opposite electrode. The organic light-emitting display apparatuses further include an encapsulation layer that covers the OLED to protect it from external moisture, external impurities, or the like.

In addition to this encapsulation layer, the organic light-emitting display apparatuses may include various other layers. Other display apparatuses, such as liquid crystal displays (LCDs), may also include various layers.

However, some of the layers of such a conventional display apparatus may be peeled off while the display apparatus is being manufactured or while a manufactured display apparatus is being used.

SUMMARY

According to an aspect of one or more embodiments, a display apparatus has components between which detachment is prevented or substantially prevented. However, the one or more embodiments described herein are only examples, and the scope of the present invention is not limited thereto.

Additional aspects will be set forth, in part, in the description which follows and, in part, will be apparent from the description, or may be learned by practice of the presented embodiments.

According to one or more embodiments, a display apparatus includes a substrate having a display area and a peripheral area outside the display area; a first insulating layer over both the display area and the peripheral area; a first dam over the peripheral area and spaced apart from the first insulating layer; an electrode power supply line over the substrate, at least a part of the electrode power supply line being located between the first insulating layer and the first dam; a protection conductive layer over the first insulating layer, the protection conductive layer extending over the electrode power supply line and electrically connected to the electrode power supply line; a pixel electrode over the first insulating layer in the display area; an opposite electrode over the pixel electrode, the opposite electrode extending to the peripheral area to contact the protection conductive layer; and a capping layer covering the opposite electrode and extending outside the opposite electrode such that an end of the capping layer is on the first insulating layer.

The display apparatus may further include an encapsulation layer covering the capping layer and extending outside the capping layer such that a lower surface of the encapsulation layer contacts the protection conductive layer.

A bonding strength between the encapsulation layer and the protection conductive layer may be higher than a bonding strength between the encapsulation layer and the capping layer.

The display apparatus may further include a protection layer between the capping layer and the encapsulation layer. The protection layer may extend outside the capping layer such that the capping layer and the encapsulation layer may not directly contact each other.

An end of the protection layer may be over the first insulating layer. In other words, an end of the protection layer may contact the protection conductive layer. The protection layer may include lithium fluoride (LiF).

A bonding strength between the protection layer and the encapsulation layer may be higher than a bonding strength between a first layer corresponding to the capping layer and a second layer corresponding to the encapsulation layer.

The display apparatus may further include a second dam between the first dam and the first insulating layer, at least a part of the second dam being located over the protection conductive layer. In this case, a height of the first dam from the substrate may be greater than a height of the second dam from the substrate. The display apparatus may further include a second insulating layer over the first insulating layer. The first dam may include a first layer including a same material as the first insulating layer and a second layer including a same material as the second insulating layer, and the second dam may include a same material as the second insulating layer.

The first insulating layer may include an aperture in the peripheral area, and an end of the capping layer may be between an end of the first insulating layer and the aperture.

The capping layer may have an upper surface corresponding to an unevenness of an upper surface of a layer below the capping layer.

BRIEF DESCRIPTION OF THE DRAWINGS

These and/or other aspects will become apparent and more readily appreciated from the following description of one or more embodiments, taken in conjunction with the accompanying drawings in which.

DETAILED DESCRIPTION

Figure 1:
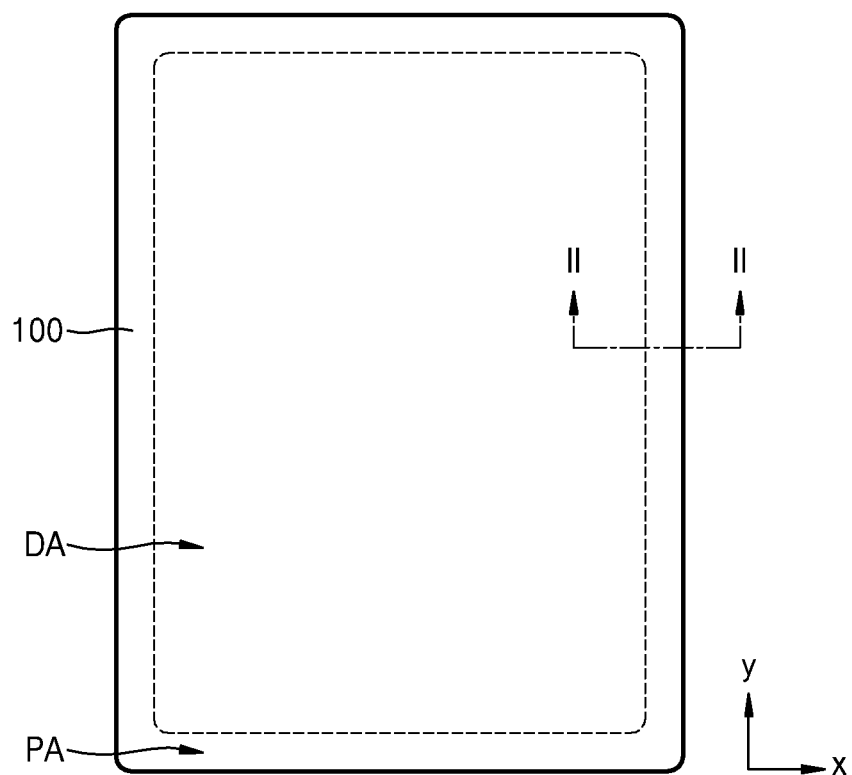
FIG. 1 is a schematic plan view of a portion of a display apparatus according to an embodiment.

As the present invention allows for various changes and numerous embodiments, some particular embodiments will be illustrated in the drawings and described in further detail in the written description. Hereinafter, effects and features of the present invention and a method for accomplishing them will be described more fully with reference to the accompanying drawings, in which some embodiments of the invention are shown. This invention may, however, be embodied in many different forms and should not be construed as limited to the embodiments set forth herein.

One or more embodiments of the invention will be described below in more detail with reference to the accompanying drawings. Those components that are the same or are in correspondence are referred to using the same reference numeral regardless of the figure, and redundant explanations may be omitted.

It will be understood that, unless otherwise specified, when an element such as a layer, film, region, or substrate is referred to as being "on" another element, it can be directly on the other element or intervening elements may also be present. In the drawings, the thicknesses of layers and regions may be exaggerated or reduced for convenience of explanation. In other words, since sizes and thicknesses of components in the drawings may be arbitrarily illustrated for convenience of explanation, the following embodiments are not limited thereto.

In the following examples, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

Figure 2:
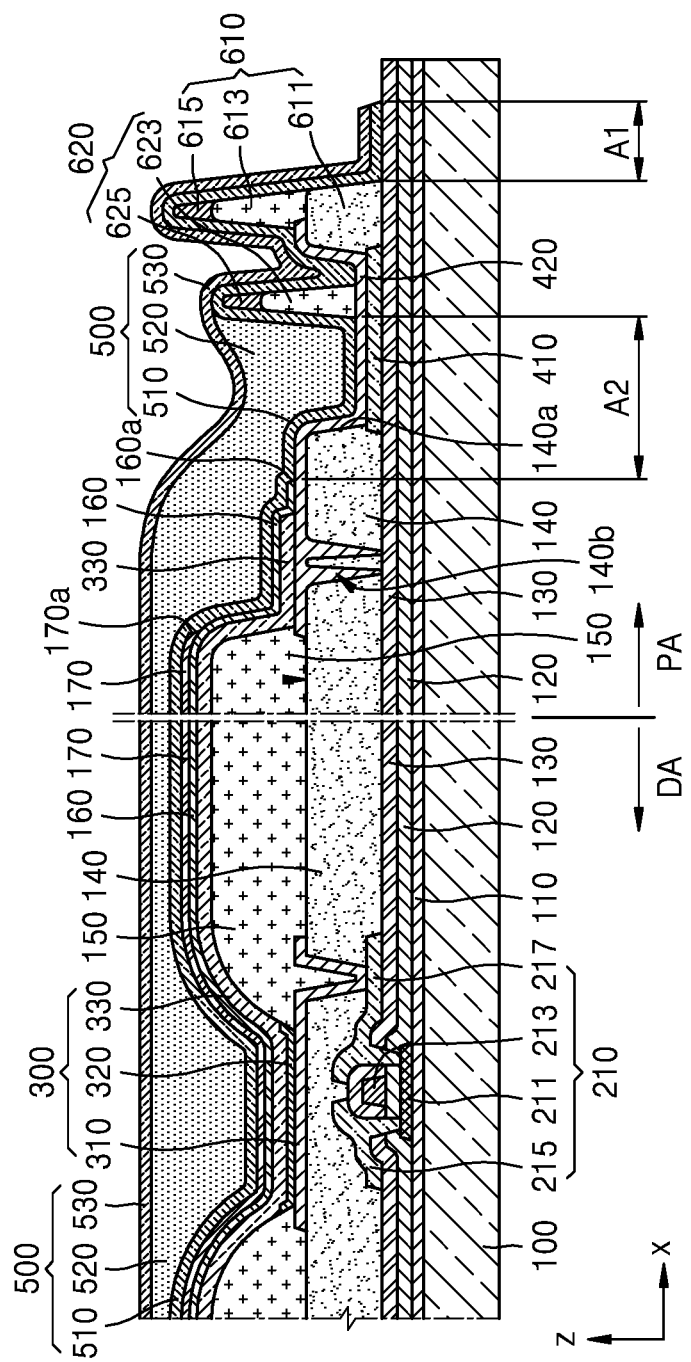
FIG. 2 is a cross-sectional view taken along a line II-II' of FIG. 1.
Figure 3:
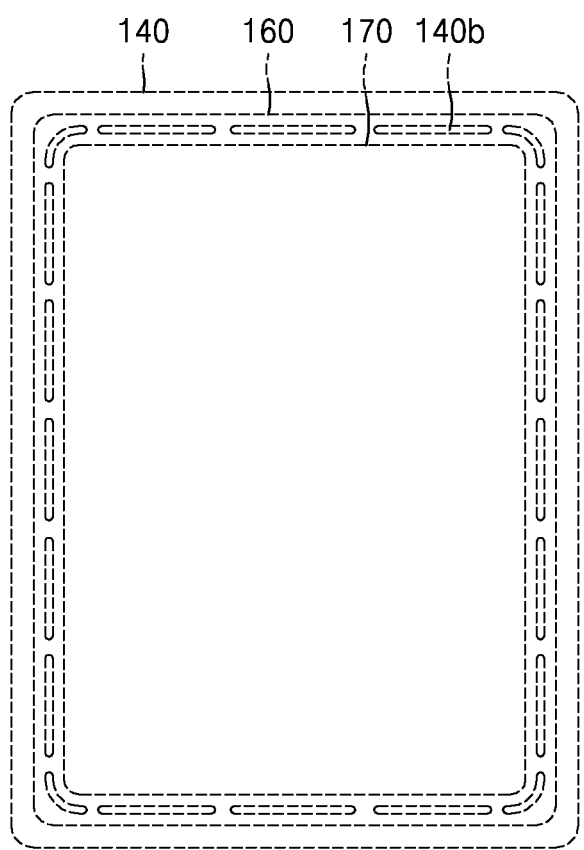
FIG. 3 is a conceptual view of a correlation between some components of the display apparatus of FIG. 2.

FIG. 1 is a schematic plan view of a portion of a display apparatus according to an embodiment of the present invention. FIG. 2 is a cross-sectional view taken along a line II-II' of FIG. 1. FIG. 3 is a conceptual view of a correlation between some components of the display apparatus of FIG. 2.

The display apparatus according to the present embodiment includes various components including a substrate 100. The substrate 100 includes a display area DA and a peripheral area PA around the display area DA. The substrate 100 may be formed of any of various materials, for example, glass, plastic, or metal. When the substrate 100 is a flexible substrate, the substrate 100 may include a polymer resin, such as polyethersulfone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), or cellulose acetate propionate (CAP).

In an embodiment, the display area DA of the substrate 100 includes a thin film transistor (TFT) 210 and may further include a display device that is electrically connected to the TFT 210. FIG. 2 illustrates an organic light-emitting device (OLED) 300 as the display device. For convenience of explanation, a case where the display apparatus according to the present embodiment includes an OLED as the display device will now be described. The OLED 300, as a display device, being electrically connected to the TFT 210 may be understood as a pixel electrode 310 being electrically connected to the TFT 210. In an embodiment, a TFT (not shown) may be arranged on the peripheral area PA of the substrate 100. The TFT located in the peripheral area PA may be a portion of a circuit unit for controlling an electrical signal applied to the display area DA.

The TFT 210 includes a semiconductor layer 211 including amorphous silicon, polycrystalline silicon, or an organic semiconductor material, a gate electrode 213, a source electrode 215, and a drain electrode 217. To planarize the surface of the substrate 100 or prevent impurities or the like from permeating the semiconductor layer 211, a buffer layer 110 formed of a silicon oxide, a silicon nitride, or a silicon oxynitride may be arranged on the substrate 100, and the semiconductor layer 211 may be located on the buffer layer 110.

The gate electrode 213 is arranged on the semiconductor layer 211, and the source electrode 215 and the drain electrode 217 electrically communicate with each other in response to a signal applied to the gate electrode 213. The gate electrode 213 may be formed of at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) in a single- or multi-layered structure, in consideration of adhesion to an adjacent layer, surface smoothness of a layer stacked on the gate electrode 213, and processability. To secure insulation between the semiconductor layer 211 and the gate electrode 213, a gate insulating layer 120 formed of a silicon oxide and/or a silicon nitride may be interposed between the semiconductor layer 211 and the gate electrode 213.

An interlayer insulating layer 130 may be arranged over the gate electrode 213 and may be formed of a silicon oxide, a silicon nitride, or a silicon oxynitride in a single-layered or multi-layered structure.

The source electrode 215 and the drain electrode 217 are arranged on the interlayer insulating layer 130. The source electrode 215 and the drain electrode 217 may be electrically connected to the semiconductor layer 211 via contact holes formed in the interlayer insulating layer 130 and the gate insulation layer 120. The source electrode 215 and the drain electrode 217 may be formed of at least one selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) in a single-layered or multi-layered structure, in consideration of conductivity or the like.

A protection layer (not shown) may be arranged on the TFT 210 having a structure in order to protect the TFT 210. The protection layer may be formed of an inorganic material, such as silicon oxide, silicon nitride, or silicon oxynitride. The protection layer may be a single layer or a stack of multiple layers.

A planarization layer 140 may be arranged on the protection layer. For example, when the OLED 300 is arranged over the TFT 210 as illustrated in FIG. 2, the planarization layer 140 may planarize an upper portion of the protection layer that covers the TFT 210. The planarization layer 140 may be formed of an organic material, such as benzocyclobutene (BCB) or hexamethyldisiloxane (HMDSO), for example. Although the planarization layer 140 is shown as a single layer in FIG. 2, any of various modifications may be made to the planarization layer 140. For example, the planarization layer 140 may be a stack of multiple layers.

The display apparatus according to the present embodiment may include both the protection layer and the planarization layer 140. In an embodiment, the display apparatus according to the present embodiment may include only the planarization layer 140. For convenience of explanation, the planarization layer 140 may be understood as a first insulation layer.

The OLED 300 may be arranged on the planarization layer 140, in the display area DA of the substrate 100. The OLED 300 includes the pixel electrode 310, an opposite electrode 330, and an intermediate layer 320 between the pixel electrode 310 and the opposite electrode 330 and including an emission layer.

An aperture that exposes at least one of the source electrode 215 and the drain electrode 217 of the TFT 210 exists in the planarization layer 140, and the pixel electrode 310 electrically connected to the TFT 210 contacts the source electrode 215 or the drain electrode 217 via the aperture and is arranged on the planarization layer 140. The pixel electrode 310 may be a transparent (or semi-transparent) electrode or a reflective electrode. When the pixel electrode 310 is a transparent (or semi-transparent) electrode, the pixel electrode 310 may include, for example, indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 310 is a reflective electrode, the pixel electrode 310 may include a reflective layer formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a layer formed of ITO, IZO, ZnO, $In_2O_3$, IGO, or AZO. Of course, embodiments are not limited thereto, and the pixel electrode 310 may include any of various other materials and may have any of various structures, such as a single-layered or multi-layered structure.

A pixel definition layer 150 may be arranged on the planarization layer 140. The pixel definition layer 150 defines pixels by including openings corresponding to sub-pixels, namely, an opening via which at least a center portion of the pixel electrode 310 is exposed. In such a case, as illustrated in FIG. 2, the pixel definition layer 150 may prevent an arc or the like from occurring on the edge of the pixel electrode 310 by increasing a distance between the edge of the pixel electrode 310 and the opposite electrode 330 arranged over the pixel electrode 310. The pixel definition layer 150 may be formed of an organic material, for example, polyimide or HMDSO. For convenience of explanation, the pixel definition layer 150 may be understood as a second insulation layer.

The intermediate layer 320 of the OLED 300 may include a low molecular weight material or a high molecular weight material. When the intermediate layer 320 includes a low-molecular weight material, the intermediate layer 320 may have a structure in which a hole injection layer (HIL), a hole transport layer (HTL), an emission layer (EML), an electron transport layer (ETL), and an electron injection layer (EIL) are stacked in a single or complex structure, and may include various organic materials including copper phthalocyanine (CuPc), N,N'-Di(naphthalene-1-yl)-N,N'-diphenyl-benzidine (NPB), and tris-8-hydroxyquinoline aluminum (Alq3). In an embodiment, these layers may be formed via vacuum deposition.

When the intermediate layer 320 includes a high-molecular weight material, the intermediate layer 320 may generally include an HTL and an EML. In this case, the HTL may include poly(ethylenedioxythiophene) (PEDOT), and the EML may include a high-molecular weight material such as a polyphenylene vinylene (PPV)-based material or a polyfluorene-based material. The intermediate layer 320 may be formed via screen printing, inkjet printing, laser induced thermal imaging (LITI), or the like.

The intermediate layer 320 is not limited to the structure described above, and may have any of various other structures.

The opposite electrode 330 is arranged on the display area DA. As illustrated in FIG. 2, the opposite electrode 330 may cover the display area DA. In other words, the opposite electrode 330 may be formed as a single body constituting a plurality of OLEDs 300, and thus may correspond to the plurality of pixel electrodes 310. The opposite electrode 330 may be a transparent (or semi-transparent) electrode or a reflective electrode. When the opposite electrode 330 is a transparent (or semi-transparent) electrode, the opposite electrode 330 may have a thin layer formed of a metal having a small work function, e.g., Li, Ca, LiF/Ca, LiF/Al, Al, Ag, Mg, or a compound thereof, and a transparent (or semi-transparent) conductive layer formed of, e.g., ITO, IZO, ZnO, or $In_2O_3$. When the opposite electrode 330 is a reflective electrode, the opposite electrode 330 may have a layer formed of Li, Ca, LiF/Ca, LiF/Al, Al, Ag, Mg, or a compound thereof. The configuration of the opposite electrode 330 and the material used to form the opposite electrode 330 are not limited to those described above, and any of various modifications may be made to the opposite electrode 330.

Because the display device, such as the OLED 300, includes the opposite electrode 330, an electrical signal (e.g., a preset electrical signal) needs to be applied to the opposite electrode 330, in order to display an image. Accordingly, an electrode power supply line 410 is located in the peripheral area PA, and thus transmits the electrical signal to the opposite electrode 330.

In an embodiment, the electrode power supply line 410 may be formed concurrently or simultaneously with forming of various conductive layers in the display area DA, and may be formed of the same material as that used to form the conductive layers. In FIG. 2, like the source electrode 215 and the drain electrode 217 of the TFT 210 in the display area DA being located on the interlayer insulating layer 130, the electrode power supply line 410 is located on the interlayer insulating layer 130 in the peripheral area PA. In an embodiment, concurrently or simultaneously with the forming of the source electrode 215 and the drain electrode 217 of the TFT 210 on the interlayer insulating layer 130 in the display area DA, the electrode power supply line 410 is formed of the same material as that used to form the source electrode 215 and the drain electrode 217, on the interlayer insulating layer 130 in the peripheral area PA. Accordingly, the electrode power supply line 410 may have the same structure as the source electrode 215 and the drain electrode 217. Embodiments are not limited thereto, and various modifications may be made to the electrode power supply line 410. For example, the electrode power supply line 410 may be formed of the same material as that used to form the gate electrode 213, on the gate insulating layer 120, concurrently or simultaneously with the forming of the gate electrode 213.

In an embodiment, the opposite electrode 330 does not directly contact the electrode power supply line 410, but, as shown in FIG. 2, may be electrically connected to the electrode power supply line 410 via a protection conductive layer 420. In other words, the protection conductive layer 420 located on the planarization layer 140, which may be understood as a first insulating layer, may extend over the electrode power supply line 410 and thus may be electrically connected to the electrode power supply line 410. Accordingly, the opposite electrode 330 may contact the protection conductive layer 420 in the peripheral area PA, and the protection conductive layer 420 may contact the electrode power supply line 410 in the peripheral area PA.

Because the protection conductive layer 420 is located on the planarization layer 140 as shown in FIG. 2, the protection conductive layer 420 may be formed of the same material as that used to form a component located on the planarization layer 140 in the display area DA, concurrently or simultaneously with the component being formed on the planarization layer 140. In an embodiment, concurrently or simultaneously with the forming of the pixel electrode 310 in the display area DA on the planarization layer 140, the protection conductive layer 420 may be formed of the same material as that used to form the pixel electrode 310, on the planarization layer 140 in the peripheral area PA. Accordingly, the protection conductive layer 420 may have the same structure as the pixel electrode 310. As shown in FIG. 2, the protection conductive layer 420 may cover a portion of the electrode power supply line 410 that is exposed without being covered by the planarization layer 140. Accordingly, as will be described later, the electrode power supply line 410 may be prevented from being damaged while a first dam 610 or a second dam 620 is being formed.

To prevent or substantially prevent impurities, such as external oxygen or moisture, from permeating into the display area DA via the planarization layer 140, the planarization layer 140 may have an aperture 140b in the peripheral area PA, as shown in FIG. 2. When the protection conductive layer 420 is formed, the protection conductive layer 420 may fill the aperture 140b. Accordingly, impurities infiltrated into the planarization layer 140 in the peripheral area PA may be effectively prevented from infiltrating into the planarization layer 140 in the display area DA.

The aperture 140b of the planarization layer 140 may have any of various shapes. In an embodiment, for example, FIG. 3 illustrates that the planarization layer 140 includes a plurality of apertures 140b spaced apart from one another along the edge of the display area DA, outside the display area DA. In another embodiment, the planarization layer 140 may have a single aperture 140b that surrounds the display area DA without any discontinuity along the edge of the display area DA. Alternatively, the planarization layer 140 may have a plurality of apertures 140b each surrounding the display area DA without any discontinuity.

A capping layer 160 that improves efficiency of the light emitted by the OLED 300 is located on the opposite electrode 330. The capping layer 160 covers the opposite electrode 330 and extends outside the opposite electrode 330, and thus an end 160a of the capping layer 160 is located on the planarization layer 140, which may be understood as a first insulation layer. In an embodiment, the end 160a of the capping layer 160 is located between the aperture 140b of the planarization layer 140 and an end 140a of the planarization layer 140. In other words, the capping layer 160 may contact the protection conductive layer 420 located below the opposite electrode 330, outside the opposite electrode 330. Because the opposite electrode 330 covers the display area DA and extends outside the display area DA, the capping layer 160 also covers the display area DA and extends to the peripheral area PA outside the display area DA. In an embodiment, the capping layer 160 includes an organic material.

As described above, the capping layer 160 improves efficiency of the light emitted by the OLED 300. For example, the capping layer 160 improves efficiency of light extraction to the outside of the display apparatus. The efficiency improvement by the capping layer 160 should be achieved uniformly in the display area DA. Considering this, the capping layer 160 may have an upper surface corresponding to an unevenness of an upper surface of a layer below the capping layer 160. In other words, as shown in FIG. 2, an upper surface of a portion of the capping layer 160 that is on the opposite electrode 330 may have a shape corresponding to an unevenness of the upper surface of the opposite electrode 330.

An encapsulation layer 500 is located on the capping layer 160. The encapsulation layer 500 protects the OLED 300 from external moisture or oxygen. To this end, the encapsulation layer 500 extends in the display area DA, in which the OLED 300 is located, and also to the peripheral area PA outside the display area DA. The encapsulation layer 500 may have a multi-layered structure as shown in FIG. 2. In an embodiment, the encapsulation layer 500 may include a first inorganic encapsulation layer 510, an organic encapsulation layer 520, and a second inorganic encapsulation layer 530.

In an embodiment, the first inorganic encapsulation layer 510 may cover the opposite electrode 160 and may include a silicon oxide, a silicon nitride, and/or a silicon oxynitride. Because the first inorganic encapsulation layer 510 is formed along structures below the first inorganic encapsulation layer 510, the upper surface thereof may not be flat, as shown in FIG. 2. The organic encapsulation layer 520 covers the first inorganic encapsulation layer 510 and has a sufficient thickness, and thus the organic encapsulation layer 520 may have an approximately flat upper surface over the entire display area DA. The organic encapsulation layer 520 may include at least one material from among polyethylene terephthalate, polyethylene naphthalate, polycarbonate, polyimide, polyethylene sulfonate, polyoxymethylene, polyarylate, and hexamethyldisiloxane. The second inorganic encapsulation layer 530 may cover the organic encapsulation layer 520 and may include a silicon oxide, a silicon nitride, and/or a silicon oxynitride. The second inorganic encapsulation layer 530 may extend outside the organic encapsulation layer 520 and contact the first inorganic encapsulation layer 510 such that the organic encapsulation layer 520 may not be exposed to the outside.

In an embodiment, since the encapsulation layer 500 includes the first inorganic encapsulation layer 510, the organic encapsulation layer 520, and the second inorganic encapsulation layer 530, even when the encapsulation layer 500 cracks due to this multi-layered structure, this crack may not be connected between the first inorganic encapsulation layer 510 and the organic encapsulation layer 520 or between the organic encapsulation layer 520 and the second inorganic encapsulation layer 530. Accordingly, formation of a path via which external moisture, oxygen, or the like permeates into the display area DA may be prevented or substantially prevented.

While the encapsulation layer 500 is being formed, structures below the encapsulation layer 500 may be damaged. For example, the first inorganic encapsulation layer 510 may be formed via chemical vapor deposition. When the first inorganic encapsulation layer 510 is formed via chemical vapor deposition, a layer directly below the first inorganic encapsulation layer 510 may be damaged. Accordingly, when the first inorganic encapsulation layer 510 is directly formed on the capping layer 160, the capping layer 160 that improves the efficiency of the light emitted by the OLED 300 may be damaged, and luminescent efficiency of the display apparatus may be reduced. Accordingly, in an embodiment, to prevent or substantially prevent damage to the capping layer 160 while the encapsulation layer 500 is being formed, a protection layer 170 is interposed between the capping layer 160 and the encapsulation layer 500. In an embodiment, the protection layer 170 may include LiF.

As described above, the capping layer 160 extends to not only the display area DA but also the peripheral area PA outside the display area DA. To prevent or substantially prevent damage of the capping layer 160 in at least the display area DA, the protection layer 170 also extends in the display area DA and also to the peripheral area PA outside the display area DA. In this case, even if the capping layer 160 is partially damaged in the peripheral area PA outside the display area DA, a degradation of an image quality recognizable by a user does not occur because display devices are not in the peripheral area PA. In an embodiment, as shown in FIGS. 2 and 3, the protection layer 170 extends outside the display area DA, and an end 170a of the protection layer 170 may be closer to the display area DA than the end 160a of the capping layer 160 is.

When the encapsulation layer 500 is formed or, in further detail, when the organic encapsulation layer 520 is formed, a material used to form the organic encapsulation layer 520 needs to be confined within an area (e.g., a preset area). To this end, as shown in FIG. 2, the first dam 610, or first dam layer, may be located in the peripheral area PA. In an embodiment, not only the buffer layer 110, the gate insulating layer 120, and the interlayer insulating layer 130, but also the planarization layer 140, which may be understood as a first insulation layer, may exist in not only the display area DA of the substrate 100 but also in the peripheral area PA, as shown in FIG. 2. The first dam 610 is spaced from the planarization layer 140, in the peripheral area PA.

The first dam 610 may have a multi-layered structure. In an embodiment, the first dam 610 may include a first layer 611, a second layer 613, and a third layer 615 stacked (e.g., sequentially stacked) in a direction away from the substrate 100. In an embodiment, the first layer 611 may be formed of the same material as and concurrently or simultaneously with the planarization layer 140, which may be understood as a first insulating layer of the display area DA, and the second layer 613 may be formed of the same material as and concurrently or simultaneously with the pixel definition layer 150, which may be understood as a second insulating layer of the display area DA. In an embodiment, the third layer 615 may be formed, on the second layer 613, of the same material as that used to form the second layer 613.

As shown in FIG. 2, the second dam 620, or second dam layer, may be further included in addition to the first dam 610 and may be located between the first dam 610 and the planarization layer 140. The second dam 620 may be located on a portion of the protection conductive layer 420 that is on the electrode power supply line 410. The second dam 620 is also spaced from the planarization layer 140, which may be understood as a first insulating layer, in the peripheral area PA. In an embodiment, the second dam 620 may have a multi-layered structure like the first dam 610, and may include a smaller number of layers than the first dam 610 to have a lower height from the substrate 100 than the first dam 610. In an embodiment, as shown in FIG. 2, the second dam 620 includes a lower layer 623 that may be formed of the same material as and concurrently or simultaneously with the second layer 613 of the first dam 610, and an upper layer 625 that may be located on the lower layer 623 and may be formed of the same material as and concurrently or simultaneously with the third layer 615 of the first dam 610.

The first dam 610 is higher than the second dam 620 as measured from the substrate 100, and also higher than the pixel defining layer 150 as measured from the substrate 100 in the display area DA. Accordingly, the first dam 610 may support masks that are used to form the intermediate layer 320 or the opposite electrode 330 of the OLED 300 or to form the capping layer 160 or the protection layer 170 in a subsequent process. The first dam 610 may prevent or substantially prevent previously-formed components from contacting and damaging the masks.

As shown in FIG. 2, the first inorganic encapsulation layer 510 of the encapsulation layer 500, which may be formed via chemical vapor deposition, covers the second dam 620 and the first dam 610 and extends outside the first dam 610. The location of the organic encapsulation layer 520 on the first inorganic encapsulation layer 510 may be restricted by the second dam 620, and thus a material used to form the organic encapsulation layer 520 may be prevented or substantially prevented from overflowing beyond the second dam 620 while the organic encapsulation layer 520 is being formed. Even if the material used to form the organic encapsulation layer 520 partially overflows beyond the second dam 620, because the location of the organic encapsulation layer 520 is also restricted by the first dam 610, the material used to form the organic encapsulation layer 520 may not further move toward the edge of the substrate 100.

In the display apparatus according to the present embodiment, the encapsulation layer 500 may be effectively prevented from being detached from other components. In an embodiment, the first inorganic encapsulation layer 510, which is a lowest layer of the encapsulation layer 500, contacts the interlayer insulating layer 130, in a first area A1 outside the first dam 610. Because the first inorganic encapsulation layer 510 and the interlayer insulating layer 130 are formed of inorganic materials, a bonding strength between the first inorganic encapsulation layer 510 and the interlayer insulating layer 130 is high. Accordingly, in the first area A1 outside the first dam 610, the encapsulation layer 500 and the interlayer insulating layer 130 maintain a good bonding state therebetween. In addition, in a second area A2 between the end 160a of the capping layer 160 and the second dam 620, the first inorganic encapsulation layer 510, which is the lowest layer of the encapsulation layer 500, contacts the protection conductive layer 420. In other words, a lowest surface of the encapsulation layer 500 contacts the protection conductive layer 420. In an embodiment, because the protection conductive layer 420 is formed of the same material as that used to form the pixel electrode 310, a bonding strength between the protection conductive layer 420 and the first inorganic encapsulation layer 510 is higher than a bonding strength between a layer formed of an organic material and the first inorganic encapsulation layer 510. In other words, the bonding strength between the protection conductive layer 420 and the first inorganic encapsulation layer 510 is higher than a bonding strength between the capping layer 160 and the first inorganic encapsulation layer 510 or a bonding strength between the first or second dam 610 or 620 and the first inorganic encapsulation layer 510. Accordingly, in the second area A2 between the end 160a of the capping layer 160 and the second dam 620, the encapsulation layer 500 and the protection conductive layer 420 maintain a good bonding state therebetween.

If an end of the capping layer 160 including an organic material were not on the planarization layer 140, which may be understood as a first insulation layer, but, rather, extended to the first dam 610 or the second dam 620 outside the planarization layer 140, the encapsulation layer 500 would contact a layer formed of an organic material in most of the area except for the first area A1, and, consequently, a bonding strength between the encapsulation layer 500 and the capping layer 160 would be low. However, in the display apparatus according to the present embodiment, a high bonding strength between the encapsulation layer 500 and a lower layer is maintained not only in the first region A1 outside the first dam 610 but also in the second region A2 between the end 160a of the capping layer 160 and the second dam 620, and, thus, detachment of the encapsulation layer 500 from a lower layer during the manufacture of the display apparatus or during the use thereof after the manufacture may be effectively prevented or minimized.

Figure 4:
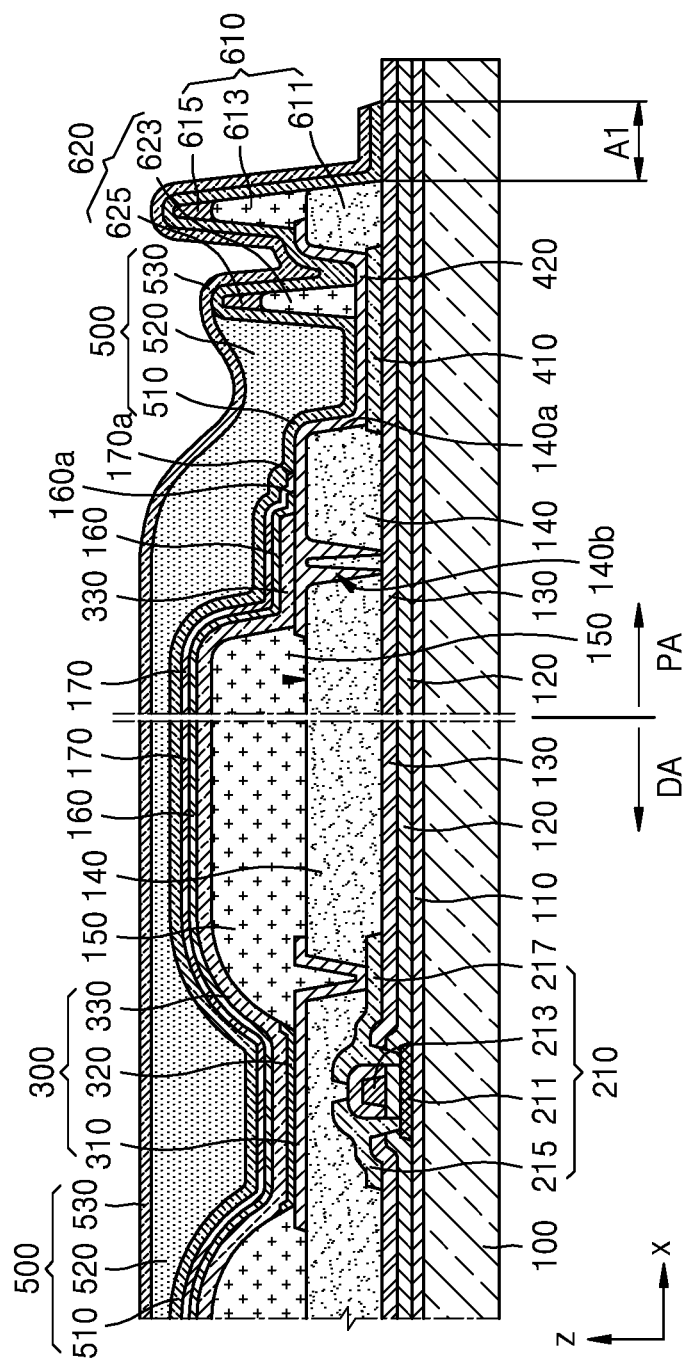
FIG. 4 is a schematic cross-sectional view of a portion of a display apparatus according to another embodiment.
Figure 5:
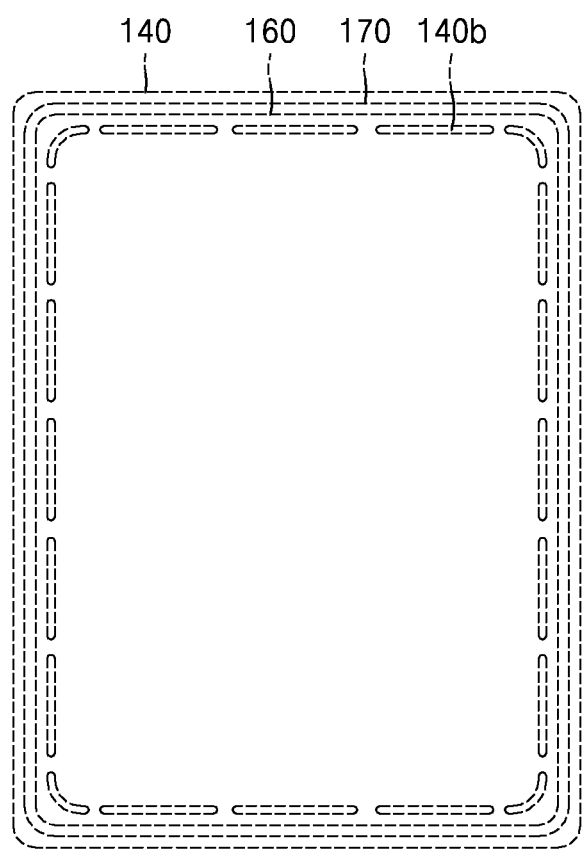
FIG. 5 is a conceptual view of a portion of the display apparatus of FIG. 4.

FIG. 4 is a schematic cross-sectional view of a portion of a display apparatus according to another embodiment; and FIG. 5 is a conceptual view of a correlation between some components of the display apparatus of FIG. 4.

The display apparatus according to the present embodiment of FIG. 4 is different from the display apparatus according to the previously-described embodiment of FIG. 2 in terms of the shape of the protection layer 170. In the display apparatus according to the present embodiment, the protection layer 170 extends outside the capping layer 160 such that the capping layer 160 and the encapsulation layer 500 may not directly contact each other. Accordingly, the end 170a of the protection layer 170 is located on the planarization layer 140, which will be understood as a first insulating layer. In further detail, as shown in FIG. 4, the end 170a of the protection layer 170 directly contacts a portion of the protection conductive layer 420 that is on the planarization layer 140.

As described above, the first inorganic encapsulation layer 510, which is the lowest layer of the encapsulation layer 500, has a higher bonding strength with a layer formed of an inorganic material than a bonding strength with a layer formed of an organic material. Because the capping layer 160 is formed of an organic material as described above, the bonding strength between the protection layer 170 and the first inorganic encapsulation layer 510 formed of an inorganic material, such as LiF, is higher than the bonding strength between the capping layer 160 and the first inorganic encapsulation layer 510. Therefore, in the display apparatus according to the present embodiment, a high bonding strength between the encapsulation layer 500 and the protection layer 170 is maintained not only in the first region A1 outside the first dam 610 but also in a region inside the first dam 610 and the second dam 620 where the protection layer 170 exists, and thus detachment of the encapsulation layer 500 from a lower layer during the manufacture of the display apparatus or during the use thereof after the manufacture may be effectively prevented or minimized.

According to one or more embodiments as described above, detachment between components of a display apparatus is prevented or substantially prevented. Of course, the scope of the present invention is not limited thereto.

While the inventive concept has been particularly shown and described with reference to some exemplary embodiments thereof, it will be understood by those of ordinary skill in the art that various changes in form and details may be made therein without departing from the spirit and scope as defined by the following claims.

What is claimed is:

1. A display apparatus comprising:
a substrate having a display area and a peripheral area outside the display area;
a first insulating layer over both the display area and the peripheral area;
a first dam over the peripheral area and spaced apart from the first insulating layer;
an electrode power supply line over the substrate, at least a part of the electrode power supply line being located between a first end of the first insulating layer in a direction to the first dam and the first dam;
a protection conductive layer over the first insulating layer, the protection conductive layer extending over the electrode power supply line and electrically connected to the electrode power supply line;
a pixel electrode over the first insulating layer in the display area;
an opposite electrode over the pixel electrode, the opposite electrode extending to the peripheral area to contact the protection conductive layer;
a capping layer covering the opposite electrode and extending outside the opposite electrode such that an end of the capping layer is on the protection conductive layer and over the first insulating layer; and
an inorganic encapsulation layer covering the capping layer and extending outside the capping layer such that a lower surface of the inorganic encapsulation layer contacts at least a portion of the protection conductive layer that is over the first insulating layer,
wherein the first insulating layer comprises an aperture penetrating completely through the first insulating layer in a thickness direction of the first insulating layer in the peripheral area at a location between the display area and the first end of the first insulating layer, the first end of the first insulating layer being located between the aperture and the first dam, and
wherein the protection conductive layer is over the first end of the first insulating layer and contacts the electrode power supply line at a location between the first end of the first insulating layer and the first dam.

2. The display apparatus of claim 1, wherein a bonding strength between the inorganic encapsulation layer and the protection conductive layer is higher than a bonding strength between the inorganic encapsulation layer and the capping layer.

3. The display apparatus of claim 1, further comprising a protection layer between the capping layer and the inorganic encapsulation layer.

4. The display apparatus of claim 3, wherein the protection layer extends outside the capping layer such that the capping layer and the inorganic encapsulation layer do not directly contact each other.

5. The display apparatus of claim 4, wherein an end of the protection layer is over the first insulating layer.

6. The display apparatus of claim 4, wherein an end of the protection layer contacts the protection conductive layer.

7. The display apparatus of claim 4, wherein the protection layer comprises lithium fluoride (LiF).

8. The display apparatus of claim 4, wherein a bonding strength between the protection layer and the inorganic encapsulation layer is higher than a bonding strength between the capping layer and the inorganic encapsulation layer.

9. The display apparatus of claim 1, further comprising a second dam between the first dam and the first insulating layer, at least a part of the second dam being located over the protection conductive layer.

10. The display apparatus of claim 9, wherein a height of the first dam from the substrate is greater than a height of the second dam from the substrate.

11. The display apparatus of claim 10, further comprising a second insulating layer over the first insulating layer, wherein the first dam comprises a first layer including a same material as the first insulating layer and a second layer including a same material as the second insulating layer, and the second dam includes a same material as the second insulating layer.

12. The display apparatus of claim 1, wherein an end of the capping layer is between an end of the first insulating layer and the aperture.

13. The display apparatus of claim 1, wherein the capping layer has an upper surface corresponding to an unevenness of an upper surface of a layer below the capping layer.

14. The display apparatus of claim 9, wherein the lower surface of the inorganic encapsulation layer contacts the protection conductive layer from the portion of the protection conductive layer that is over the first insulating layer to the second dam.

15. The display apparatus of claim 1, wherein the protection conductive layer fills the aperture.

* * * * *